(12) United States Patent
Tanaka (10) Patent No.: US 10,790,163 B2
(45) Date of Patent: Sep. 29, 2020

(54) SEMICONDUCTOR SENSOR AND METHOD FOR MANUFACTURING THE SAME

(71) Applicant: DENSO CORPORATION, Kariya, Aichi-pref. (JP)

(72) Inventor: Masaaki Tanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 1 day.

(21) Appl. No.: 16/250,146

(22) Filed: Jan. 17, 2019

(65) Prior Publication Data

US 2019/0148174 A1 May 16, 2019

Related U.S. Application Data

(63) Continuation of application No. PCT/JP2017/022096, filed on Jun. 15, 2017.

(30) Foreign Application Priority Data

Aug. 12, 2016 (JP) .................. 2016-158534

(51) Int. Cl.
| | |
|---|---|
| H01L 21/56 | (2006.01) |
| B29C 45/14 | (2006.01) |
| B29C 45/26 | (2006.01) |
| B29C 45/17 | (2006.01) |
| H01L 23/495 | (2006.01) |
| B29C 45/00 | (2006.01) |
| B29L 31/34 | (2006.01) |

(Continued)

(52) U.S. Cl.
CPC ...... *H01L 21/565* (2013.01); *B29C 45/14065* (2013.01); *B29C 45/14655* (2013.01); *B29C 45/17* (2013.01); *B29C 45/26* (2013.01); *H01L 21/56* (2013.01); *H01L 23/49541* (2013.01);

*B29C 45/0046* (2013.01); *B29L 2031/34* (2013.01); *B29L 2031/752* (2013.01); *H01L 23/3107* (2013.01); *H01L 2224/73265* (2013.01); *H01L 2924/181* (2013.01)

(58) Field of Classification Search
CPC ... H01L 21/565; H01L 21/56; H01L 23/3107; H01L 23/49541; B29C 45/26; B29L 2031/34; B29L 2031/752

See application file for complete search history.

(56) References Cited

U.S. PATENT DOCUMENTS

| | | | |
|---|---|---|---|
| 10,586,773 B2 * | 3/2020 | Taguchi | ............. H01L 23/4952 |
| 2006/0014328 A1 | 1/2006 | Shimonaka et al. | |

(Continued)

FOREIGN PATENT DOCUMENTS

JP 2015-076450 A 4/2015

*Primary Examiner* — Seahvosh Nikmanesh
(74) *Attorney, Agent, or Firm* — Posz Law Group, PLC (57) ABSTRACT

In a method for manufacturing a semiconductor sensor, an upper mold has a pair of projections on a wall surface opposing to side surfaces of a semiconductor chip in a first cavity and at positions closest to a second cavity. The projections project so as to reduce the space between the side surfaces of the semiconductor chip and the upper mold, so that a flow of a resin material from a first cavity to a second cavity is delayed. The resin material is filled in the first cavity prior to the second cavity. After a portion of a film corresponding to the first cavity is entirely brought into close contact with the upper mold, the resin material is filled in the second cavity.

4 Claims, 8 Drawing Sheets

(51) Int. Cl.
    *B29L 31/00*     (2006.01)
    *H01L 23/31*     (2006.01)

(56) References Cited

U.S. PATENT DOCUMENTS

| | | |
|---|---|---|
| 2008/0213947 A1 | 9/2008 | Shimonaka et al. |
| 2008/0290484 A1* | 11/2008 | Low .................. H01L 24/97 257/675 |
| 2010/0164082 A1 | 7/2010 | Fujisawa |
| 2015/0330820 A1 | 11/2015 | Sakuma |
| 2016/0146652 A1 | 5/2016 | Ishitsuka et al. |
| 2016/0322552 A1* | 11/2016 | Miki ................ H01L 23/49548 |

\* cited by examiner

SEMICONDUCTOR SENSOR AND METHOD FOR MANUFACTURING THE SAME

CROSS REFERENCE TO RELATED APPLICATIONS

The present application is a continuation application of International Patent Application No. PCT/JP2017/022096 filed on Jun. 15, 2017, which designated the U.S. and claims the benefit of priority from Japanese Patent Application No. 2016-158534 filed on Aug. 12, 2016. The entire disclosures of all of the above applications are incorporated herein by reference.

TECHNICAL FIELD

The present disclosure relates to a semiconductor sensor and a method for manufacturing the semiconductor sensor.

BACKGROUND ART

For example, a semiconductor sensor has a semiconductor chip and a molded resin part. The molded resin part covers the semiconductor chip such that a portion of the semiconductor chip is exposed from the molded resin part. Such a semiconductor sensor is manufactured using a mold including an upper mold and a lower mold, which form a cavity between them. The upper mold has a protrusion at a position corresponding to an exposed portion of the semiconductor chip so as to expose the portion of the semiconductor chip from the molded resin part.

SUMMARY

The present disclosure provides a semiconductor sensor and a method for manufacturing the semiconductor sensor. The semiconductor sensor has an island portion, a semiconductor chip and a resin molded part. The semiconductor chip is disposed such that a back surface is mounted on the island portion, and is molded with the molded resin part such that a first region of the semiconductor chip having a sensing portion is exposed from the molded resin part, and a second region of the semiconductor ship and a part of the island portion are covered.

BRIEF DESCRIPTION OF DRAWINGS

The above and other objects, features and advantages of the present disclosure will become more apparent from the following detailed description made with reference to the accompanying drawings, in which like parts are designated by like reference numbers and in which.

DETAILED DESCRIPTION

As an example of manufacturing a semiconductor sensor in which a semiconductor chip is partly exposed from a molded resin part, a semiconductor chip is prepared, as well as a mold including an upper mold and a lower mold is prepared. The upper mold has a protrusion at a position corresponding to the exposed portion of the semiconductor chip.

Next, a film is attached to an entire surface of the upper mold facing the lower mold. The semiconductor chip is arranged on the lower mold, and then the upper mold is coupled to the lower mold so that a portion of the film attached to the upper mold and corresponding to the end of the projection of the upper mold is brought into contact with the semiconductor chip. In this state, a resin material is injected into a cavity of the mold and is cured, to thereby form the molded resin part.

Thereafter, the film is separated from the molded resin part and the semiconductor chip. In this way, the semiconductor sensor in which the portion of the semiconductor chip that was in contact with the film and includes a periphery of the contact portion are exposed from the molded resin part is obtained.

In such a technique, although the film is brought into contact with the semiconductor chip at a part, the film is attached to the entire surface of the upper mold facing the lower mold. As another example, it is conceivable to attach the film only to a portion of the upper mold corresponding to the exposed portion of the semiconductor chip.

In such an example, however, the film may have a portion closely in contact with the upper mold and a portion separated from the mold depending on the shape of the upper mold. If there is a space between an end of the film and the upper mold, the resin material may enter the space. To avoid this situation, the film needs to be attached to the entirety of the upper mold, resulting in waste of the film.

According to an aspect of the present disclosure, a manufacturing method relates to a method for manufacturing a semiconductor sensor that has an island portion, a semiconductor chip and a molded resin part. The island portion is made of metal, and has a plate shape. The semiconductor chip has a plate shape having a front surface, a side surface, and a back surface. The semiconductor chip is disposed such that the back surface is mounted on the island portion. The semiconductor chip includes a first region and a second region connecting to the first region, and the first region and the second region provide the front surface. The semiconductor chip has a sensing portion configured to sense a physical quantity in the first region. The molded resin part covers a part of the island portion, and the second region and the side surface of the semiconductor chip while exposing the first region. The method includes: preparing a lead frame and the semiconductor chip; mounting the semiconductor chip to the lead frame; preparing a mold; attaching a film; closing the mold; molding; separating; and cutting.

In the preparing of the lead frame, a metallic plate-shaped lead frame, which includes the island portion and a gate portion connecting to the island portion and being formed with a through hole, and the semiconductor chip are prepared. In the mounting of the semiconductor chip to the lead frame, the semiconductor chip is mounted on a portion of the lead frame corresponding to the island portion.

In the preparing of the mold, a mold having an upper mold and a lower mold is prepared. When coupled to each other, the upper mold and the lower mold form a first cavity and a second cavity in a direction of connection of the first region and the second region, the first cavity being located adjacent to the first region from a boundary between the first region and the second region, the second cavity being located adjacent to the second region from the boundary between the first region and the second region. The lower mold has an introducing portion for introducing a resin material of the molded resin part.

In the attaching of the film, a film is attached to a portion of a wall surface of the upper mold, the portion of the wall surface facing the lower mold and corresponding to the first cavity.

In the closing of the mold, the upper mold and the lower mold are closed and coupled to each other to form the first cavity and the second cavity in a state where the lead frame is arranged on the lower mold such that the through hole is located above the introducing portion, and in such a manner that a portion of the film attached to the upper mold is in contact with the first region of the semiconductor chip and the lead frame.

In the molding of the molded resin part, after the closing of the mold, the resin material is injected from the introducing portion into the first cavity through the through hole and further into the second cavity from the first cavity, and the resin material is cured.

In the separating, after the molding, the mold and the film are separated from the molded resin part. In the cutting, a distal end portion of the molded resin part including the gate portion is cut.

In addition, the upper mold prepared in the preparing has a pair of projections on portions of the wall surface, the portions facing the side surface of the semiconductor chip in the first cavity, and at positions closest to the second cavity. The pair of projections project so as to interpose the semiconductor chip and to reduce a dimension of a space between the side surface and the upper mold.

In the molding, the pair of projections delays a flow of the resin material from the first cavity to the second cavity, so that the resin material is filled in the second cavity, after the first cavity is filled with the resin material and the portion of the film corresponding to the first cavity is entirely brought into close contact with the upper mold.

In the method according to the first aspect, the first cavity is filled with the resin material prior to the second cavity. Therefore, even if there is a space between the end of the film adjacent to the second cavity and the upper mold, this space can be removed by filling the resin material. As such, it is possible to restrict the resin material from entering the space. In addition, it is not necessary to attach the film to an entire region of the wall surface of the upper mold corresponding to the first cavity and the second cavity. Accordingly, the amount of the film to be adhered to the upper mold can be reduced.

According to a second aspect of the present disclosure, a semiconductor sensor includes an island portion, a semiconductor chip and a molded resin part. The island portion is made of metal, and has a plate shape. The semiconductor chip has a plate shape having a front surface, a side surface, and a back surface. The semiconductor chip is disposed such that the back surface is mounted on the island portion. The semiconductor chip includes a first region and a second region connecting to the first region, and the first region and the second region provide the front surface. The semiconductor chip has a sensing portion configured to sense a physical quantity in the first region. The molded resin part covers a part of the island portion, the second region and the side surface of the semiconductor chip while exposing the first region.

The molded resin part has a recess at a contact portion that is a part of the molded resin part covering the second region of the semiconductor chip and is in contact with a boundary between the first region and the second region. The recess defines a curved recess recessed in a direction separating from the first region with respect to a direction in which the first region and the second region connect to each other.

Hereinafter, embodiments of the present disclosure will be described with reference to the drawings. Note that parts mutually same or equivalent in the embodiments are designated with the same reference numbers in the drawings.

First Embodiment

Hereinafter, a first embodiment of the present disclosure will be described with reference to the drawings. A semiconductor sensor of the present embodiment is, for example, configured as a physical quantity sensor, such as a pressure sensor, a flow sensor, or an acceleration sensor.

Figure 1:
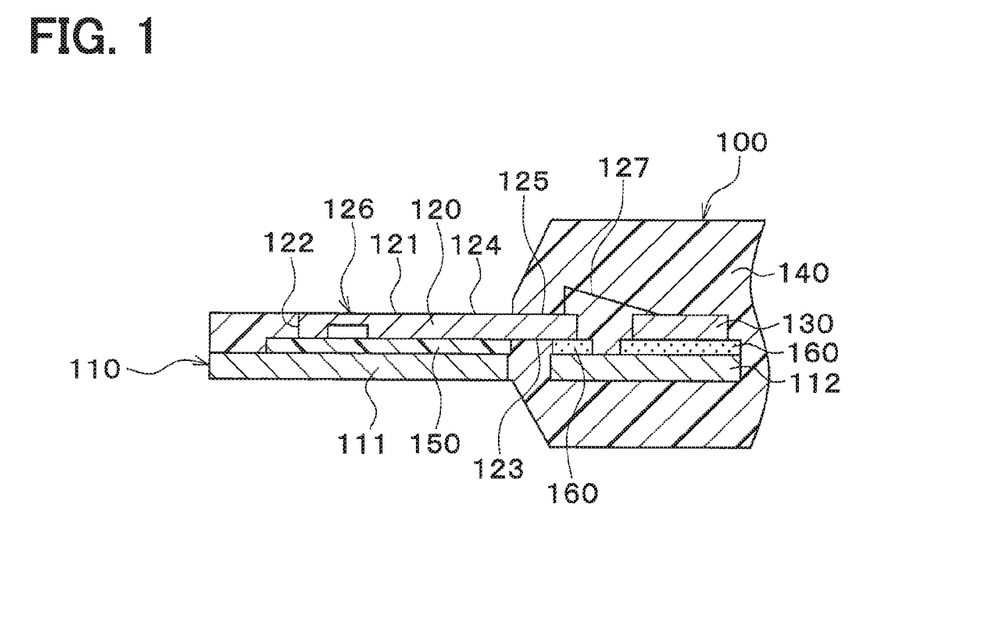
FIG. 1 is a diagram illustrating a cross-sectional view of a semiconductor sensor according to a first embodiment of the present disclosure.

As shown in FIG. 1, a semiconductor sensor 100 includes a lead frame 110, a semiconductor chip 120, a circuit chip 130, and a molded resin part 140.

The lead frame 110 is a metallic plate-shaped member functioning as a fixing part for the semiconductor chip 120 and the circuit chip 130 as well as a terminal electrically connecting the circuit chip 130 and an external device. The lead frame 110 has a first island portion 111, a second island portion 112 and a plurality of terminals, which are not illustrated.

The first island portion 111 is a member on which the semiconductor chip 120 is mounted. The second island portion 112 is a member on which a part of the semiconductor chip 120 and the circuit chip 130 are mounted. The plurality of terminals are members to electrically connect the circuit chip 130 and the external device. The plurality of terminals are insert-molded in the molded resin part 140 to partly expose from the molded resin part 140.

The semiconductor chip 120 is made of a semiconductor substrate having a plate shape with a front surface 121, a side surface 122 and a back surface 123. The semiconductor chip 120 is mounted in such a manner that a part of the back surface 123 is integrated to the first island portion 111 with a film 150, and another part of the back surface 123 is integrated to the second island portion 112 with an adhesive material 160.

The semiconductor chip 120 has a first region 124 and a second region 125 connected to the first region 124. The first region 124 and the second region 125 provide the front surface 121. The semiconductor chip 120 has a sensing portion 126 for sensing a physical quantity in the first region 124. In a case of detecting a pressure or flow rate as the physical quantity, the sensing portion 126 is provided by a diaphragm formed by thinning a part of the semiconductor chip 120. In a case of detecting an acceleration, the sensing portion 126 is configured as a MEMS structure, for example.

The circuit chip 130 is provided with a signal processing circuit for performing a predetermined computation to a detection signal received from the semiconductor chip 120. The circuit chip 130 is integrated to the second island portion 112 with the adhesive material 160.

The semiconductor chip 120 and the circuit chip 130 are provided with a plurality of pads, which are not illustrated. The semiconductor chip 120 and the circuit chip 130 are electrically connected to each other through bonding wires 127 bonded to the pads. Although not illustrated, the circuit chip 130 and the terminals are also connected through bonding wires.

The molded resin part 140 is a member that covers a part of the lead frame 110, the second region 125 and the side surface 122 of the semiconductor chip 120 and the circuit chip 130 while exposing the first region 124 of the front surface 121 of the semiconductor chip 120. The molded resin part 140 is made of a resin material, such as an epoxy resin.

Figure 2:
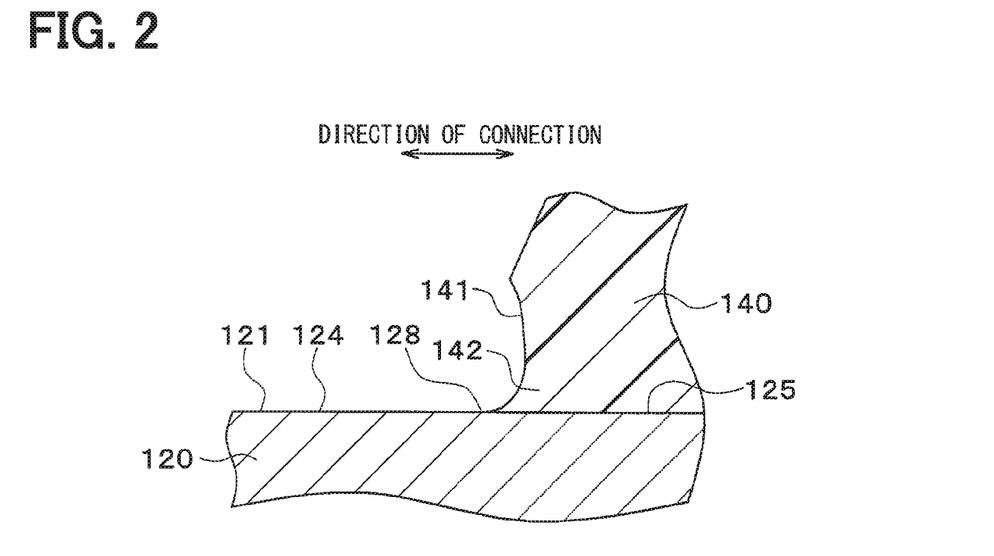
FIG. 2 is a diagram illustrating an enlarged cross-sectional view of a part around the boundary between a first region and a second region of a semiconductor chip of the semiconductor sensor.

As shown in FIG. 2, the molded resin part 140 is formed with a recess 141. The recess 141 is formed at a contact portion 142 that is a portion of the molded resin part 140 covering the second region 125 of the semiconductor chip 120 and being in contact with a boundary between the first region 124 and the second region 125. The recess 141 has a curved shape or a concave shape recessed in a direction separating from the first region 124 along a direction of connection between the first region 124 and the second region 125.

The recess 141 of the molded resin part 140 is necessarily formed when the molded resin part 140 is formed. The formation of the recess 141 will be described in detail in association with a manufacturing process of the semiconductor sensor 100. Note that, in FIG. 1, the recess 141 is not illustrated. The semiconductor sensor 100 has the configurations described hereinabove.

Figure 3:
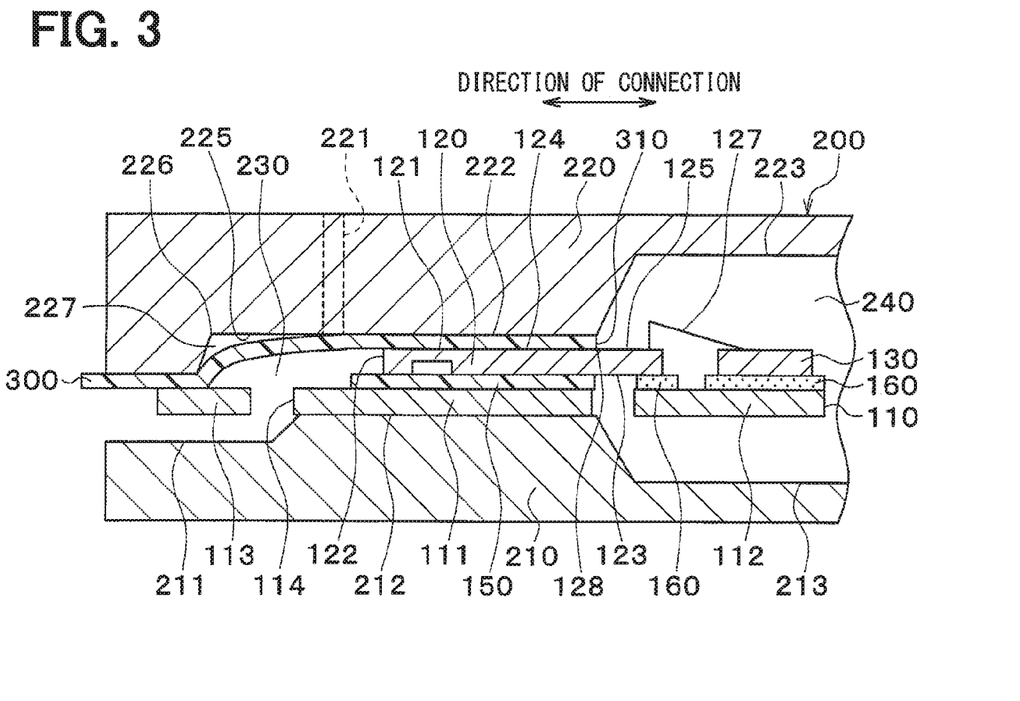
FIG. 3 is a diagram illustrating a cross-sectional view for explaining a preparation step, an attaching step, and a mold closing step.
Figure 4:
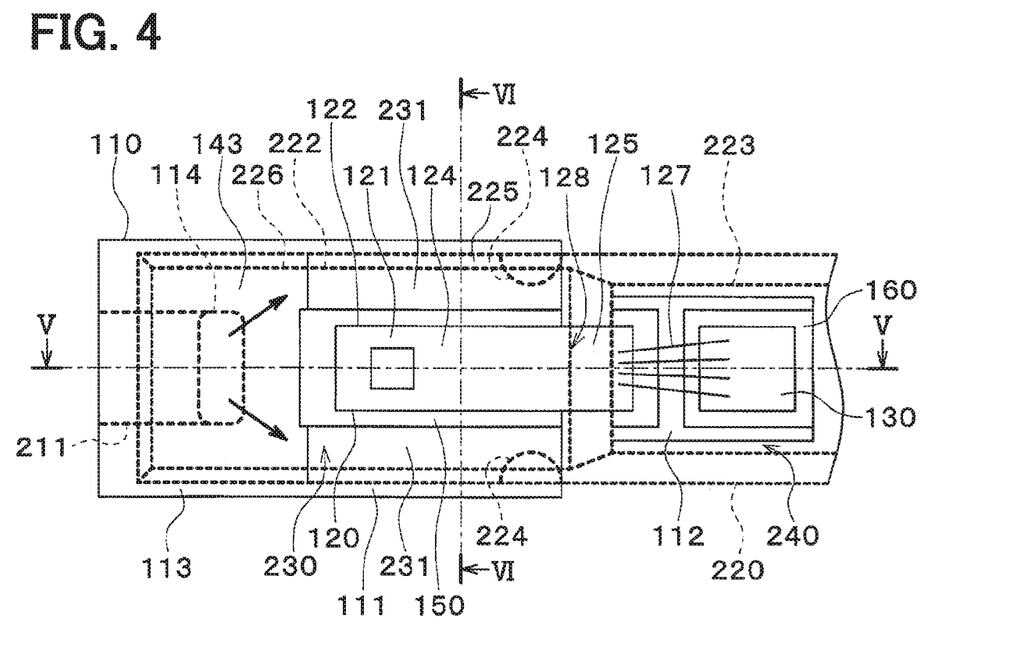
FIG. 4 is a diagram illustrating a plan view for explaining a resin molding step.

Next, a method for manufacturing the semiconductor sensor 100 will be explained. Firstly, a mounting step is performed. As shown in FIGS. 3 and 4, a lead frame 110 that has a gate portion 113, island portions 111 and 112, and terminals is prepared. The gate portion 113 connects to the first island portion 111. The gate portion 113 is formed with a through hole 114. The through hole 114 functions as a passage to allow a resin material 143.

In addition, a semiconductor chip 120 is prepared. Then, the semiconductor chip 120 is mounted to portions of the lead frame 110 corresponding to the island portions 111 and 112. Similarly, a circuit chip 130 is mounted to a portion of the lead frame 110 corresponding to the second island portion 112. Further, wire bonding is performed.

Next, a preparation step of preparing a mold 200 is performed. The mold 200 includes a lower mold 210 and an upper mold 220 that is coupled to the lower mold 210. As shown in FIG. 3, when the lower mold 210 and the upper mold 220 are coupled to each other, the mold 200 forms a first cavity 230 and a second cavity 240.

The lower mold 210 has an introducing portion 211 for introducing the resin material 143, an arrangement portion 212 onto which the first island portion 111 is arranged, and a depressed portion 213 providing the second cavity 240. In the present embodiment, the introducing portion 211 is configured as a side gate.

The upper mold 220 has an adhesion hole 221 communicating with the first cavity 230, a step portion 222 providing the first cavity 230, and a depressed portion 223 providing the second cavity 240. The adhesion hole 221 is a suction hole so as to adhere a film 300 to the upper mold 220. The film 300 is a buffer material to be interposed between the first region 124 of the semiconductor chip 120 and the upper mold 220.

As shown in FIG. 4, the upper mold 220 has a pair of projections 224. The pair of projections 224 are located on a wall surface 225 of the upper mold 220 facing the lower mold 210 and the side surface 112 of the semiconductor chip 120 and at positions closest to the second cavity 240 in the first cavity 230. Note that, in FIG. 4, the film 300 is not illustrated.

The pair of projections 224 project from the wall surface 225 so as to interpose the semiconductor chip 120 between them. The pair of projections 224 function as portions narrowing gaps 231 defined between the side surface 122 of the semiconductor chip 120 and the wall surface 225 of the upper mold 220.

Next, an attaching step of attaching the film 300 to the upper mold 220 is performed. Specifically, the film 300 is attached to a part of the wall surface 225 of the upper mold 220, the part adjacent to the first cavity 230. In other words, the film 300 is attached to the part of the wall surface 225 of the upper mold 220, the part forming the step portion 222. The film 300 is not attached to a part of the wall surface 225 of the upper mold 220, the part forming the depressed portion 223.

As shown in FIG. 3, the upper mold 220 has a corner portion 226 due to the shape of the step portion 222. It is difficult to attach the film 300 to such a corner portion 226. Therefore, a space 227 is likely to be generated between the film 300 and the upper mold 220.

Thereafter, a mold closing step is performed. Specifically, the first island portion 111 of the lead frame 110 is arranged on the arrangement portion 212 of the lower mold 210 such that the through hole 114 is located above the introducing portion 211. Further, a part of the film 300, which has been attached to the upper mold 220, is brought into contact with the first region 124 of the semiconductor chip 120, and the gate portion 113 and the first island portion 111 of the lead frame 110. Then, the lower mold 210 and the upper mold 220 are coupled to each other to form the first cavity 230 and the second cavity 240 in the mold 200.

The first cavity 230 is a space beginning from the boundary between the first region 124 and the second region 125 of the semiconductor chip 120 and extending toward the first region 124 in the direction of connection of the first region 124 and the second region 125. The first cavity 230 is a space surrounded by the gate portion 113 and the first island portion 111 of the lead frame 110, the side surface 122 of the semiconductor chip 120, and the step portion 222 of the upper mold 220.

On the other hand, the second space 240 is a space beginning from the boundary 128 toward the second region 125 in the direction of connection. The second cavity 240 is a space surrounded by the depressed portion 213 of the lower mold 210 and the depressed portion 223 of the upper mold 220. An end portion 310 of the film 300 is located at a position corresponding to the boundary 128 between the first region 124 and the second region 125 of the semiconductor chip 120 and is exposed into the second cavity 240.

Figure 5:
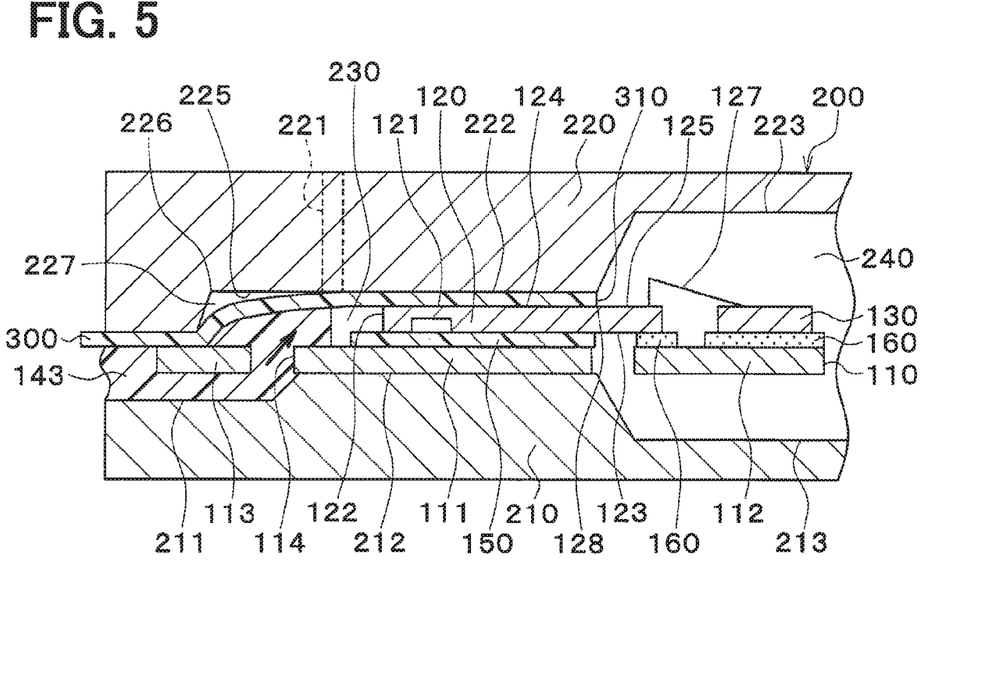
FIG. 5 is a diagram illustrating a cross-sectional view taken along a line V-V in FIG. 4.

Next, a resin molding step of forming a molded resin part 140 is performed. Firstly, the film 300 is adhered to the upper mold 220 by suctioning through the adhesion hole 221. As shown in FIGS. 4 and 5, a resin material 143 is injected from the introducing portion 211 of the lower mold 210 into the first cavity 230 through the through hole 114. The resin material 143 is further injected into the second cavity 240 through the first cavity 230.

Figure 6:
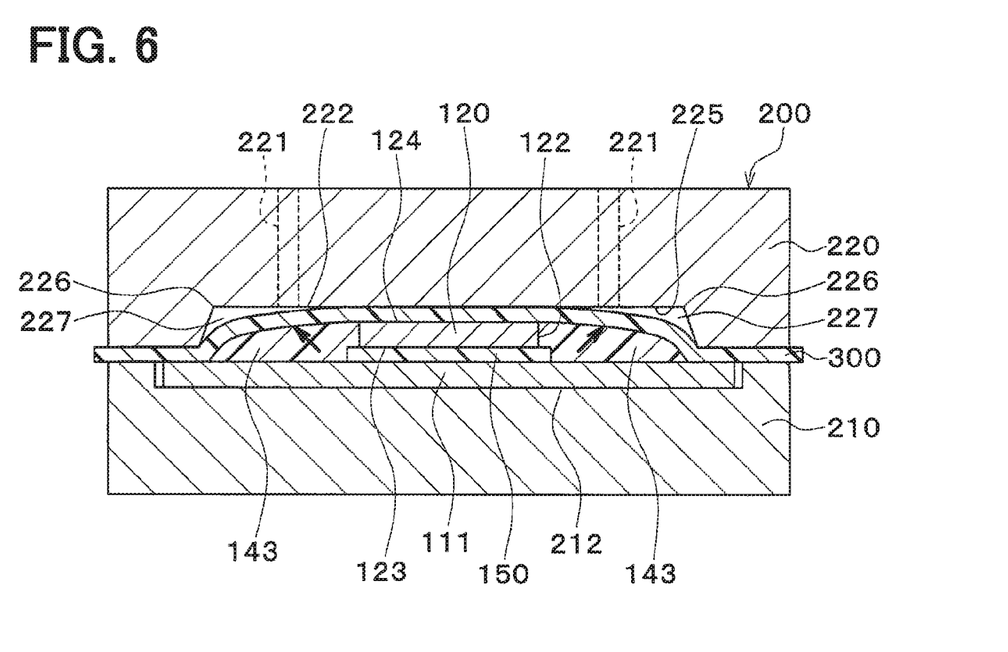
FIG. 6 is a diagram illustrating a cross-sectional view taken along a line VI-VI in FIG. 4.

When injecting the resin material 143, the flow of the resin material 143 from the first cavity 230 to the second cavity 240 is delayed by means of the pair of projections 224. Therefore, as shown in FIG. 6, the resin material 143 is filled in the first cavity 230 and urges the film 300 toward the upper mold 220. As a result, the space 227 between the film 300 and the upper mold 220 disappears. In this way, since the resin material 143 is filled in the first cavity 230 prior to the second cavity 240, the part of the film 300 corresponding to the first cavity 230 can be entirely and closely in contact with the upper mold 220.

Figure 7:
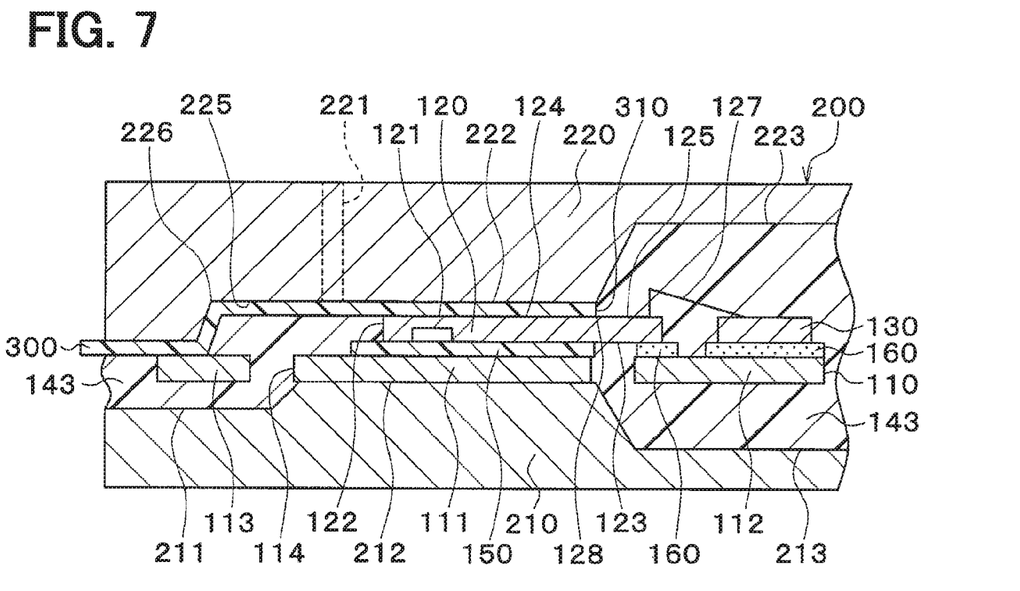
FIG. 7 is a diagram illustrating a cross-sectional view for explaining the resin molding step.

Thereafter, the resin material 143 flows into the second cavity 240 from the first cavity 230, and filled in the resin material 143. Thus, as shown in FIG. 7, the first cavity 230 and the second cavity 240 are filled with the resin material 143. Then, the resin material 143 is cured, to thereby form the molded resin part 140.

Figure 8:
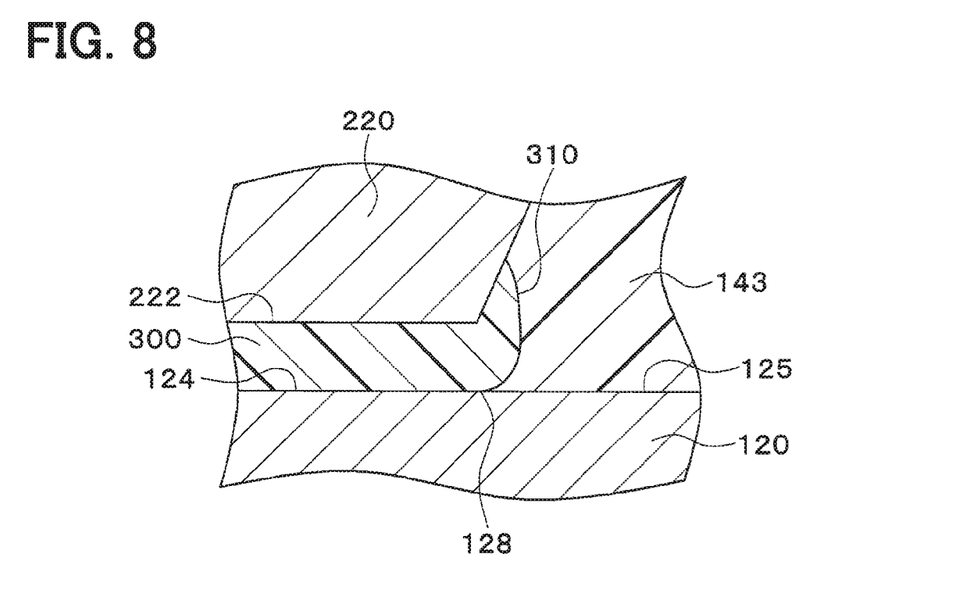
FIG. 8 is a diagram illustrating an enlarged cross-sectional view around an end portion of a film in the resin molding step.

In this case, the film 300 is compressed as being interposed between the upper mold 220 and the semiconductor chip 120. Therefore, as shown in FIG. 8, the film 300 is elastically deformed, and the end portion 310 of the film 300 is pushed out into the second cavity 240. Specifically, the end portion 310 is protruded into a rounded shape toward the second region 125 in the direction of connection. With this, when the resin material 143 is being filled in the second cavity 240, a part of the resin material 143, which is in contact with the end portion 310, has a shape corresponding to the shape of the end portion 310, and thus is made as the recess 141 of the molded resin part 140.

As described above, since the end portion 310 of the film 300 is deformed to have a curved surface, when the resin material 143 injected in the second cavity 240 urges the end portion 310 toward the first cavity 230, the stress generated at the surface of the end portion 310 can be suppressed.

Figure 9:
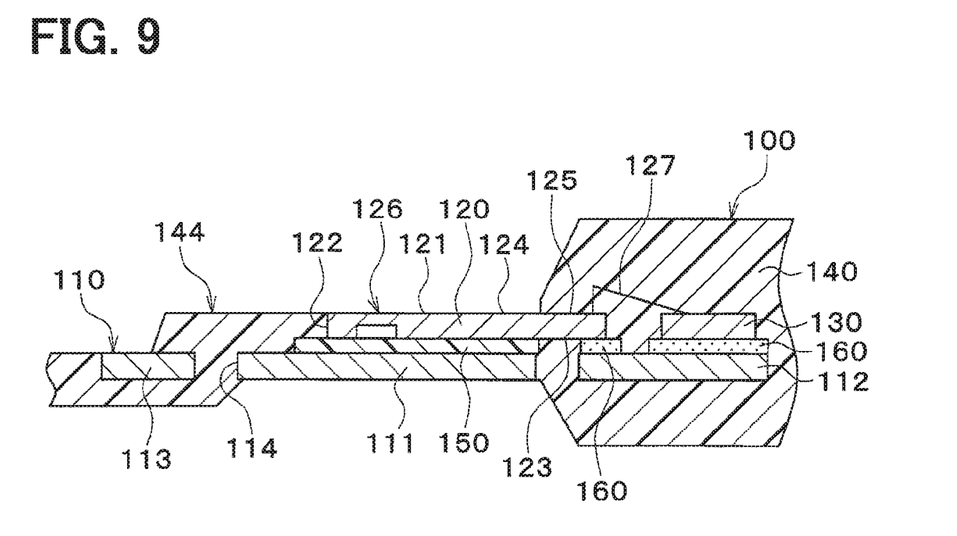
FIG. 9 is a diagram illustrating a cross-sectional view for explaining a mold separation step.

Next, as shown in FIG. 9, a mold separation step of separating the mold 200 and the film 300 from the molded resin part 140 is performed. Thereafter, a cutting step of cutting a distal end portion 144 of the molded resin part 140 including the gate portion 113 is performed. That is, a gate break is performed. At the same time as cutting the distal end portion 144, unnecessary portions of the lead frame 110, such as a dam bar, may be cut off. In this way, the semiconductor sensor 100 is finished.

Figure 10:
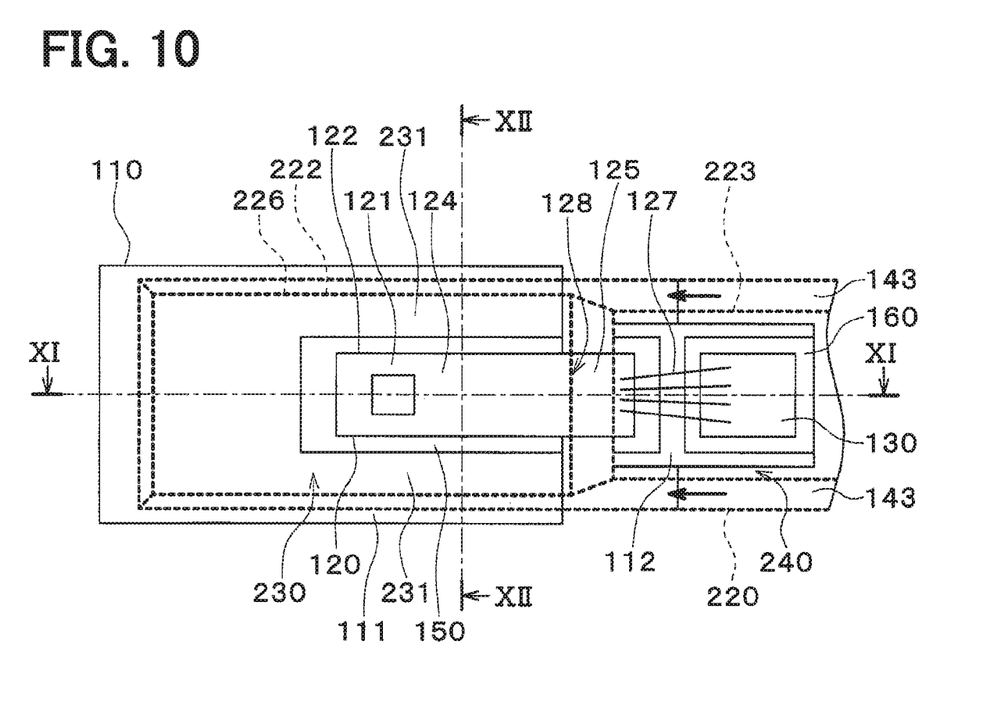
FIG. 10 is a diagram illustrating a plan view for explaining a comparative example.

As a comparative example of the injection method of the resin material 143, a case in which a resin material 143 is injected to a second cavity 240 prior to a first cavity 230 will be described. In this case, a mold 200 has an introducing portion, which is not illustrated, communicating with the second cavity 240.

Figure 11:
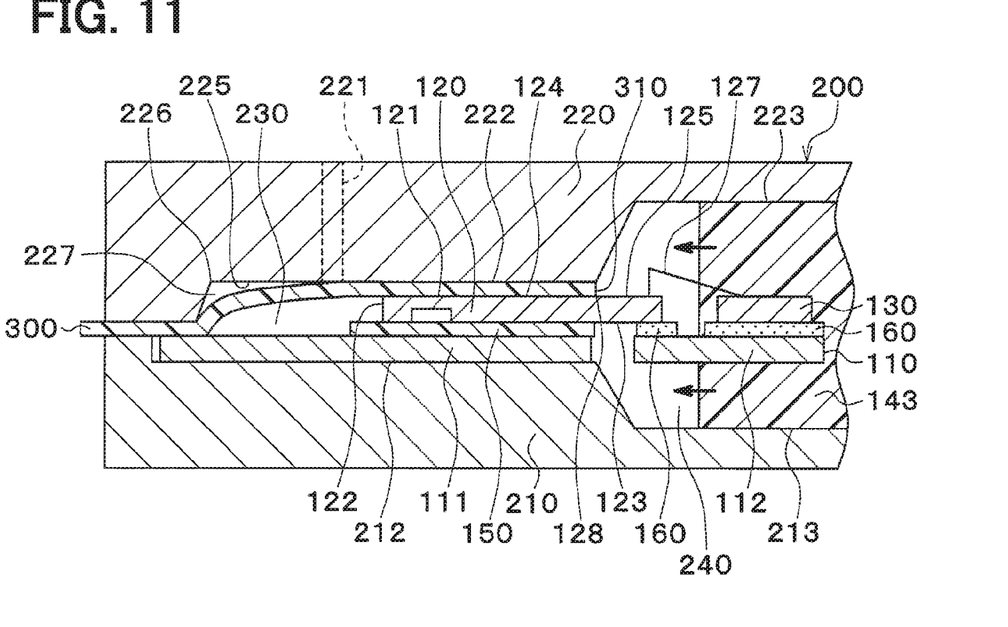
FIG. 11 is a diagram illustrating a cross-sectional view taken along a line XI-XI in FIG. 10.
Figure 12:
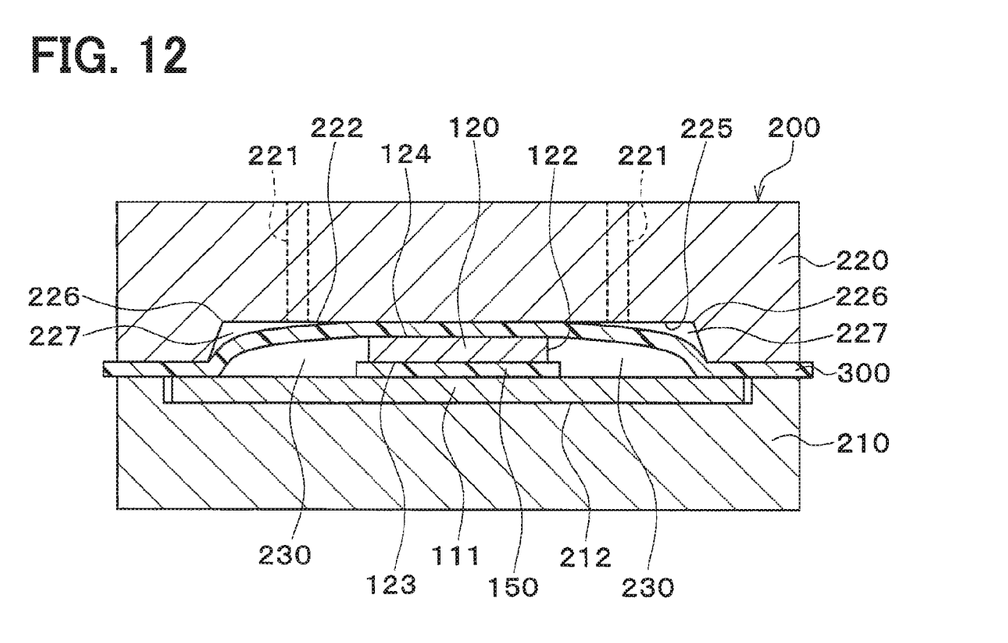
FIG. 12 is a diagram illustrating a cross-sectional view taken along a line XII-XII in FIG. 10.

In this case, as shown in FIGS. 10 and 11, the resin material 143 is filled into the second cavity 240 from an area adjacent to the terminals of the lead frame 110. As shown in FIG. 12, however, if there is a space 227 between the upper mold 220 and the film 300, at the corner portion 226 of the upper mold 220, the resin material 143 enters the space 227 from the second cavity 240. Therefore, the injection method of injecting the resin material 143 from the second cavity 240 to the first cavity 230 cannot be used.

In the present embodiment, on the other hand, the first cavity 230 is filled with the resin material 143 prior to the second cavity 240. Therefore, even if there is a space 227 between the upper mold 220 and the end portion 310 of the film 300 adjacent to the second cavity 240, the resin material 143 is urged to the space 227 and thus the space 227 disappears. Therefore, it is less likely that the resin material 143 will enter the space 227.

As described above, since the space 227 can be removed, it is not necessary to attach the film 300 to a region of the wall surface 225 of the upper mold 220, the region corresponding to the second cavity 240. In other words, it is not necessary to attach the film 300 to the entirety of the wall surface 225 of the upper mold 220. As such, the used amount of the film 300 to be attached to the upper mold 220 can be reduced.

Figure 13:
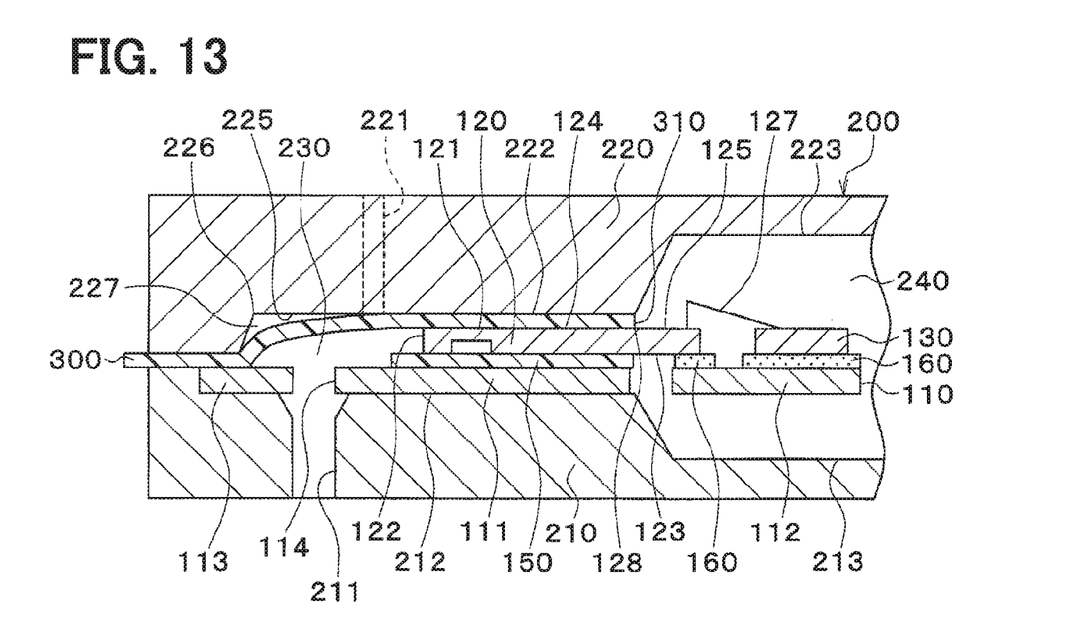
FIG. 13 is a diagram illustrating a cross-sectional view for explaining a modification of the first embodiment.

As a modification of the lower mold 210, the introducing portion 211 of the lower mold 210 may be configured as a top gate, as shown in FIG. 13. In this case, an introduction path of the resin material 143 from the introducing portion 211 to the first cavity 230 through the through hole 114 can be shortened.

As a modification of the through hole 114, the number of the through hole 114 is not limited to one. Also, the planar shape of the through hole 114 is not limited to a rectangular shape.

Note that, the first island portion 111 corresponds to an "island portion".

Second Embodiment

Figure 14:
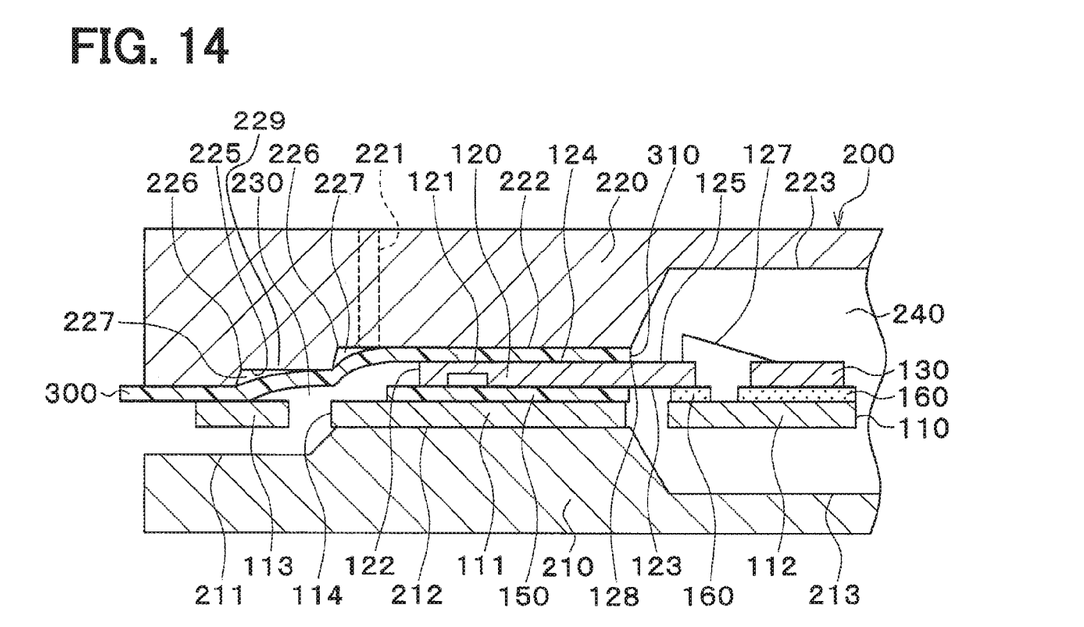
FIG. 14 is a diagram illustrating a cross-sectional view of an upper mold according to a second embodiment.

In the present embodiment, parts different from the first embodiment will be described. In a preparation step of the present embodiment, as shown in FIG. 14, an upper mold 220 having a protrusion 229 is prepared. The protrusion 229 is a part of a wall surface 225 of the upper mold 220 opposing to the gate portion 113, and protrudes more than the step portion 222, which opposes the first island portion 111, toward the gate portion 113.

Figure 15:
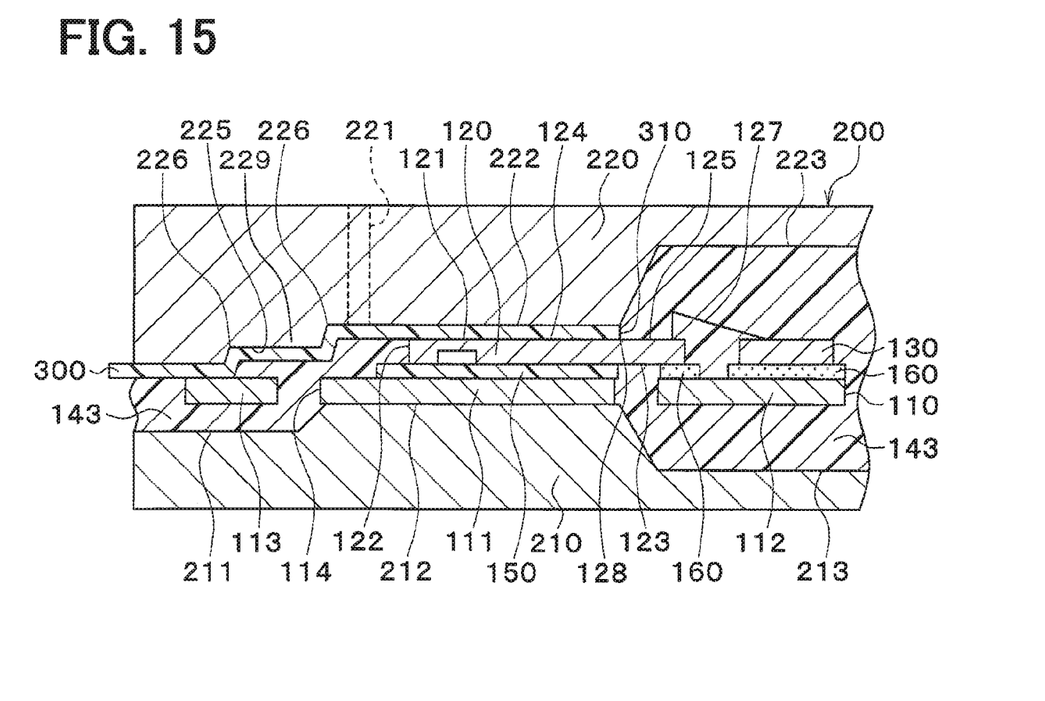
FIG. 15 is a diagram illustrating a cross-sectional view for explaining a resin molding step according to the second embodiment.
Figure 16:
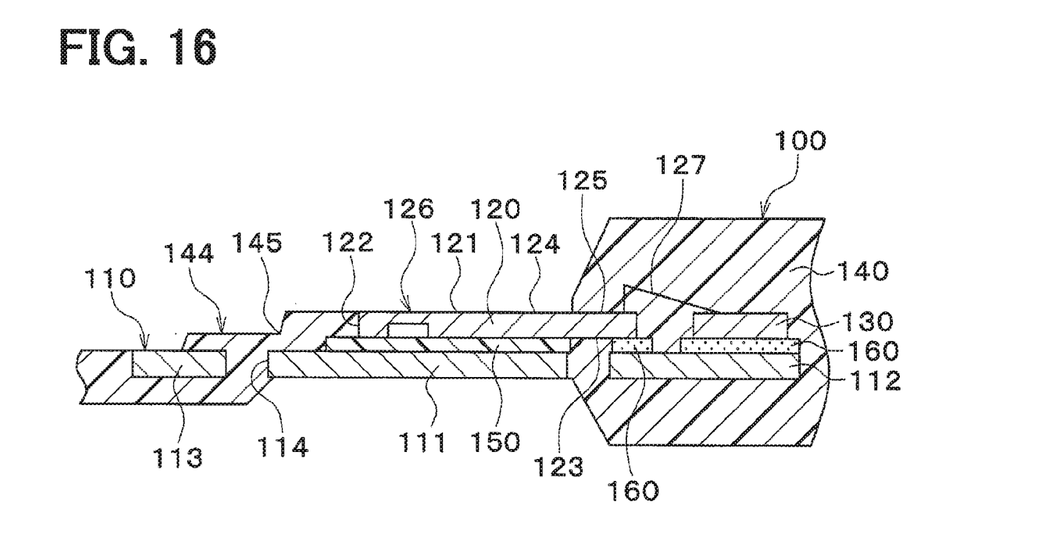
FIG. 16 is a diagram illustrating a cross-sectional view of a molded resin part produced by the resin molding step according to the second embodiment.

As shown in FIG. 15, a resin molding step is performed using this upper mold 220. Because of the protrusion 229 of the upper mold 220, the height of a space of the first cavity 230 adjacent to the gate portion 113 is lower than the height of a space of the first cavity 230 adjacent to the first island portion 111. The height of the space corresponds to the width in a direction in which the lead frame 110 is sandwiched by the lower mold 210 and the upper mold 220. As shown in FIG. 16, therefore, the thickness of a portion of the molded resin part 140 corresponding to the gate portion 113 can be made thinner than the thickness of a portion of the molded resin part 140 corresponding to the first island portion 111.

In a cutting step performed thereafter, a distal end portion 144 of the molded resin part 140 is cut at a position where the thickness is differentiated. Since the portion of the molded resin part 140 corresponding to the gate portion 113 is thinner than the portion of the molded resin part 140 corresponding to the first island portion 111, the stress of cutting can be concentrated on a corner portion 145 at the step of the molded resin part 140. Therefore, it is less likely that the molded resin part 140 will be damaged when the distal end portion 144 is cut off.

Other Embodiments

The semiconductor sensors 100 of the above-described embodiments are examples, and are not limited to the configurations indicated hereinabove. The semiconductor sensor 100 may have any other configuration as long as realizing the present disclosure. For example, the semiconductor sensor 100 may have a configuration without having the second island portion 112 or the circuit chip 130. The molded resin part 140 may have any other shape. The mold 200 may be suitably prepared according to the shape of the molded resin part 140.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing a semiconductor sensor, the semiconductor sensor including:
    an island portion that is made of metal and has a plate shape;
    a semiconductor chip that
        has a plate shape having a front surface, a side surface, and a back surface,
        is disposed such that the back surface is mounted on the island portion,
        includes a first region and a second region connecting to the first region,
        has a sensing portion configured to sense a physical quantity in the first region, the first region and the second region providing the front surface; and
    a molded resin part that covers a part of the island portion and the second region and the side surface of the semiconductor chip while exposing the first region,
    the method comprising:
    preparing a metallic plate-shaped lead frame that includes the island portion and a gate portion connecting to the island portion and being formed with a through hole, and the semiconductor chip;
    mounting the semiconductor chip to a portion of the lead frame corresponding to the island portion;
    preparing a mold having a lower mold and an upper mold, the lower mold having an introducing portion for introducing a resin material of the molded resin part, the upper mold forming a first cavity and a second cavity in a direction of connection of the first region and the second region when being coupled to the lower mold, the first cavity being on a side adjacent to the first region from a boundary between the first region and the second region, the second cavity being on a side adjacent to the second region from the boundary between the first region and the second region;
    attaching a portion of a film to a portion of a wall surface of the upper mold, the portion of the wall surface facing the lower mold and corresponding to the first cavity;
    closing the mold by coupling the upper mold and the lower mold to form the first cavity and the second cavity in a state where the lead frame is arranged on the lower mold such that the through hole is located above the introducing portion, and in such a manner that the portion of the film attached to the upper mold is in contact with the first region of the semiconductor chip and the lead frame;
    molding the molded resin part, after the closing of the mold, by injecting the resin material from the introducing portion into the first cavity through the through hole and further into the second cavity from the first cavity, and by curing the resin material;
    separating the mold and the film from the molded resin part, after the molding; and
    cutting a distal end portion of the molded resin part, after the separating of the mold and the film, the distal end portion including the gate portion; wherein
    the upper mold prepared in the preparing has a pair of projections on the wall surface at portions facing the side surface of the semiconductor chip in the first cavity and at positions closest to the second cavity, the pair of projections project so as to interpose the semiconductor chip and to reduce a dimension of a space between the side surface and the upper mold, and
    in the molding, the resin material is filled in the second cavity after the resin material is filled in the first cavity and the portion of the film corresponding to the first cavity is entirely brought into close contact with the upper mold, by delaying a flow of the resin material from the first cavity to the second cavity by the pair of projections.

2. The method for manufacturing the semiconductor device according to claim 1, wherein
    the lower mold prepared in the preparing of the mold has the introducing portion configured as a side gate.

3. The method for manufacturing the semiconductor device according to claim 1, wherein
    the lower mold prepared in the preparing of the mold has the introducing portion configured as a top gate.

4. The method for manufacturing the semiconductor device according to claim 1, wherein
    the upper mold prepared in the preparing of the mold has a protrusion that protrudes toward the gate portion than a portion of the upper mold facing the island portion,
    in the molding, the molded resin part is molded such that a thickness of a portion of the molded resin part corresponding to the gate portion is smaller than a thickness of a portion of the molded resin part corresponding to the island portion by the protrusion, and
    in the cutting, the distal end portion is cut at a position at which the thickness of the resin molded part is differentiated.

* * * * *